US011472002B2

(12) United States Patent
Shinozaki et al.

(10) Patent No.: US 11,472,002 B2
(45) Date of Patent: Oct. 18, 2022

(54) SUBSTRATE POLISHING APPARATUS

(71) Applicant: EBARA CORPORATION, Tokyo (JP)

(72) Inventors: Hiroyuki Shinozaki, Tokyo (JP);
Hiroshi Aono, Tokyo (JP); Tadakazu Sone, Tokyo (JP); Kenji Shinkai, Tokyo (JP); Hideo Aizawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 198 days.

(21) Appl. No.: 16/784,757

(22) Filed: Feb. 7, 2020

(65) Prior Publication Data
US 2020/0198093 A1 Jun. 25, 2020

Related U.S. Application Data

(62) Division of application No. 14/699,075, filed on Apr. 29, 2015, now Pat. No. 10,576,604.

(30) Foreign Application Priority Data

Apr. 30, 2014 (JP) .................................. 2014-094137
May 29, 2014 (JP) .................................. 2014-111263

(51) Int. Cl.
B24B 37/34 (2012.01)
B24B 55/06 (2006.01)
(Continued)

(52) U.S. Cl.
CPC .............. B24B 37/34 (2013.01); B24B 55/06 (2013.01); B24B 55/12 (2013.01);
(Continued)

(58) Field of Classification Search
None
See application file for complete search history.

(56) References Cited

U.S. PATENT DOCUMENTS 4,635,434 A 1/1987 Suzuki
5,653,623 A * 8/1997 Kimura ................. B24B 53/017
451/72

(Continued)

FOREIGN PATENT DOCUMENTS

JP H05-251413 A 9/1993
JP H07-223142 A 8/1995
(Continued)

OTHER PUBLICATIONS

Japanese Office Action issued in Patent Application No. JP-2015-098706 dated Jun. 19, 2018.
(Continued)

Primary Examiner — Sylvia MacArthur
(74) Attorney, Agent, or Firm — Pearne & Gordon LLP

(57) ABSTRACT

A substrate polishing apparatus includes a polishing table 30 having a polishing surface 10 in the upper surface, a substrate holding portion 31 that holds a substrate W having a surface to be polished in the lower surface, and a holding portion cover 36 that covers the outer side of the substrate holding portion 31. Between the lower portion of the holding portion cover 36 and the upper surface of the polishing table 30, a gap portion for intake 37 is provided, and in the upper portion of the holding portion cover 36, a pipe for exhaust 39 connected to an exhaust mechanism 38 is provided. By operating the exhaust mechanism 38, a rising air current from the gap portion 37 toward the pipe 39 is formed between the outer surface of the substrate holding portion 31 and the inner surface of the holding portion cover 36.

11 Claims, 18 Drawing Sheets

(51) Int. Cl.
  *B24B 55/12* (2006.01)
  *H01L 21/3105* (2006.01)
  *H01L 21/321* (2006.01)
  *H01L 21/768* (2006.01)
  *H01L 21/306* (2006.01)

(52) U.S. Cl.
  CPC .. *H01L 21/30625* (2013.01); *H01L 21/31051* (2013.01); *H01L 21/32115* (2013.01); *H01L 21/7684* (2013.01)

(56) References Cited

U.S. PATENT DOCUMENTS

| | | | |
|---|---|---|---|
| 6,036,582 A * | 3/2000 | Aizawa | B23Q 37/00 451/288 |
| 6,042,455 A * | 3/2000 | Togawa | B24B 37/345 451/45 |
| 6,139,677 A | 10/2000 | Togawa et al. | |
| 6,139,680 A | 10/2000 | Chen et al. | |
| 6,383,332 B1 | 5/2002 | Shelton et al. | |
| 6,793,769 B2 | 9/2004 | Kajino et al. | |
| 7,332,055 B2 | 2/2008 | Orii et al. | |
| 7,988,535 B2 | 8/2011 | Chen et al. | |
| 7,998,308 B2 * | 8/2011 | Kaneko | H01L 21/68728 156/345.55 |
| 8,268,114 B2 | 9/2012 | Masumura et al. | |
| 8,679,286 B2 | 3/2014 | Yamauchi et al. | |
| 9,579,768 B2 * | 2/2017 | Motoshima | B24B 49/14 |
| 9,969,046 B2 * | 5/2018 | Motoshima | B24B 53/017 |
| 2009/0264049 A1 | 10/2009 | Chen et al. | |
| 2011/0081832 A1 * | 4/2011 | Nakamura | B24B 37/10 451/28 |
| 2011/0159782 A1 * | 6/2011 | Sone | B24B 37/10 451/7 |
| 2012/0220196 A1 * | 8/2012 | Maruyama | B24B 37/04 451/7 |
| 2013/0210324 A1 * | 8/2013 | Kosuge | B24B 37/04 451/72 |
| 2013/0240000 A1 | 9/2013 | Aizawa et al. | |
| 2014/0213158 A1 | 7/2014 | Umemoto et al. | |
| 2015/0314418 A1 | 11/2015 | Hiroyuki et al. | |
| 2020/0198093 A1 * | 6/2020 | Shinozaki | B24B 55/06 |

FOREIGN PATENT DOCUMENTS

| | | |
|---|---|---|
| JP | H10-264014 A | 10/1998 |
| JP | 2002-018368 A | 1/2002 |
| JP | 2003-100683 A | 4/2003 |
| JP | 2003-324082 A | 11/2003 |
| JP | 2004-249452 A | 9/2004 |
| JP | 2005-286221 A | 10/2005 |
| JP | 2008-166709 A | 7/2008 |
| JP | 2009-177566 A | 8/2009 |
| JP | 2013-188686 A | 9/2013 |
| WO | 2004-060610 A2 | 7/2004 |

OTHER PUBLICATIONS

Decision to Grant a Patent issued in Japanese Patent Application No. 2014-094137 dated May 8, 2018.
Singapore Office Action issued in Patent Application No. SG 10201503374Q dated Nov. 22, 2017.
Japanese Office Action issued in Patent Application No. JP-2014-094137 dated Oct. 24, 2017.

* cited by examiner

SUBSTRATE POLISHING APPARATUS

CROSS-REFERENCE TO RELATED APPLICATIONS

This is a division of U.S. patent application Ser. No. 14/699,075, filed Apr. 29, 2015, which claims the benefit of Japanese Priority Patent Applications 2014-094137 filed on Apr. 30, 2014 and 2014-111263 filed on May 29, 2014, the entire contents of which are incorporated herein by reference.

FIELD

This technology relates to a substrate polishing apparatus that polishes a substrate surface (surface to be polished), and particularly to a substrate polishing apparatus suitable for a situation where a hazardous gas is generated.

BACKGROUND AND SUMMARY

Conventionally, a hazardous liquid chemical may be used to polish a compound semiconductor substrate (wafer). For example, for an SiC substrate, HF may be used. Also, For a GaAs substrate, harmful arsenic may be mixed into a polishing waste liquid. Thus, in a conventional substrate polishing apparatus, a polishing environment is locally isolated and exhaust is carried out by a down flow system, preventing the leakage of a toxic substance to the outside. For example, Japanese Patent Laid-Open No. 2008-166709 describes such a technology.

However, in the conventional substrate polishing apparatus, it is necessary to improve tightness and enhance an exhaust volume in each portion of the apparatus, so that it becomes necessary to make significant design changes. Therefore, it has been desired to develop an apparatus capable of preventing the diffusion of a hazardous gas effectively without a significant design change.

A substrate polishing apparatus of one embodiment includes a polishing table having a polishing surface in an upper surface, a substrate holding portion that holds a substrate having a surface to be polished in a lower surface and presses the surface to be polished of the substrate against the polishing surface of the polishing table to polish the surface to be polished of the substrate, and a holding portion cover that covers an outer side of the substrate holding portion, in which between a lower portion of the holding portion cover and the upper surface of the polishing table, a gap portion for intake is provided, and in an upper portion of the holding portion cover, a pipe for exhaust connected to an exhaust mechanism is provided, and by operating the exhaust mechanism, a rising air current from the gap portion toward the pipe is formed between an outer surface of the substrate holding portion and an inner surface of the holding portion cover.

A substrate polishing apparatus of another embodiment includes a rotating polishing table, a substrate holding portion that holds a substrate and presses the substrate against the polishing table to polish the substrate, and a local exhaust mechanism whose intake head is disposed near the substrate holding portion, in which the intake head is disposed on a downstream side of the substrate holding portion in a rotation direction of the polishing table.

DETAILED DESCRIPTION OF NON-LIMITING EXAMPLE EMBODIMENTS

Figure 1:
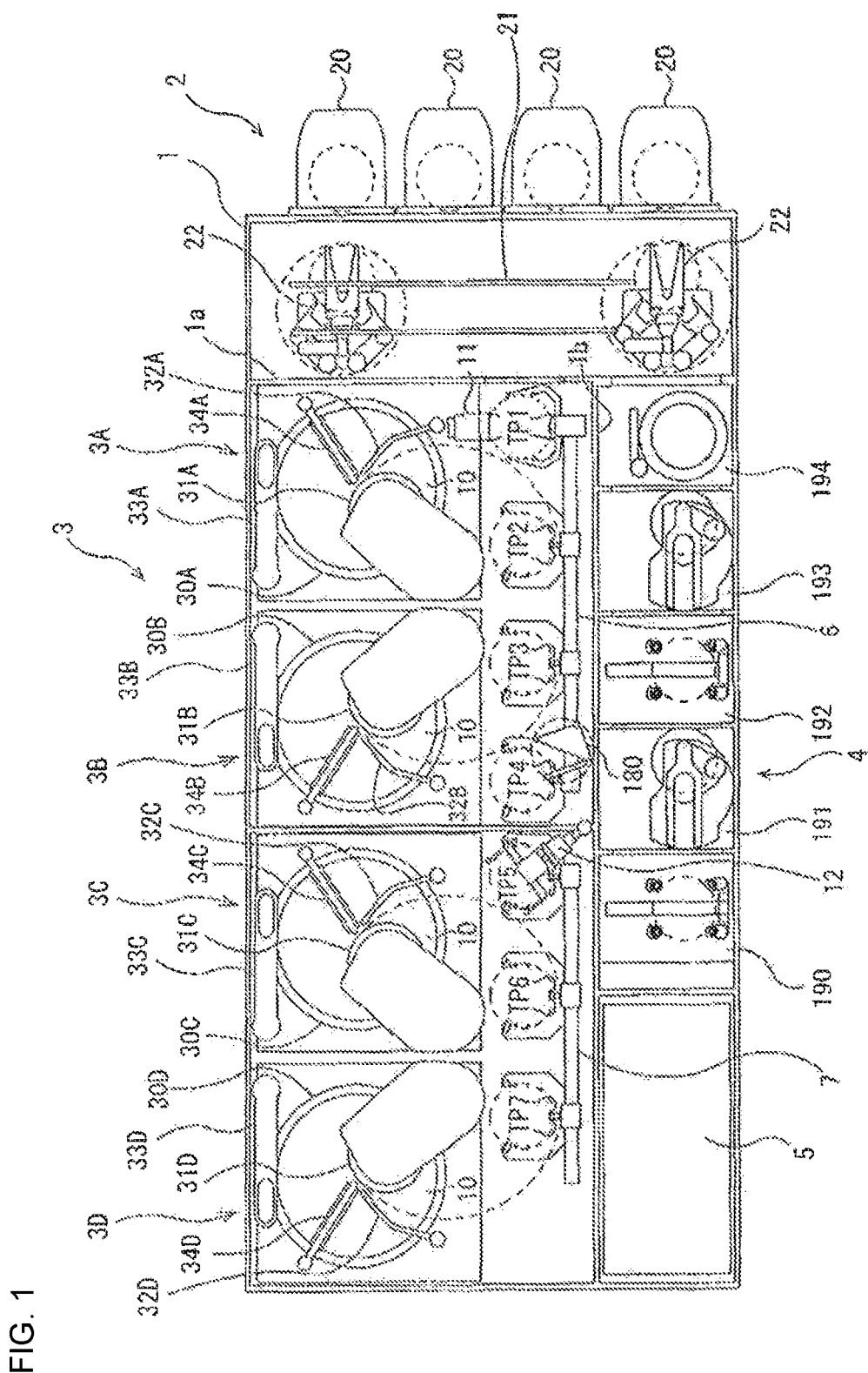
FIG. 1 is a plan view illustrating a whole configuration of a substrate processing apparatus in a first embodiment.

Now, a substrate polishing apparatus of an embodiment will be described below. Note that the embodiment to be described below illustrates one example where this technology is implemented, and this technology should not be limited to a specific configuration to be described below. When this technology is implemented, a specific configuration may be appropriately adopted depending on an embodiment.

A substrate polishing apparatus of one embodiment includes a polishing table having a polishing surface in an upper surface, a substrate holding portion that holds a substrate having a surface to be polished in a lower surface and presses the surface to be polished of the substrate against the polishing surface of the polishing table to polish the surface to be polished of the substrate, and a holding portion cover that covers an outer side of the substrate holding portion, in which between a lower portion of the holding portion cover and the upper surface of the polishing table, a gap portion for intake is provided, and in an upper portion of the holding portion cover, a pipe for exhaust connected to an exhaust mechanism is provided, and by operating the exhaust mechanism, a rising air current from the gap portion toward the pipe is formed between an outer surface of the substrate holding portion and an inner surface of the holding portion cover.

According to this configuration, even if a hazardous gas is generated between a polishing surface and a surface to be polished when a substrate is polished, then the holding portion cover that covers the outer side of the substrate holding portion can prevent the hazardous gas from diffusing from the site of generation to the environment. In such a situation, the gas diffusion can be effectively prevented near the site of generation of the hazardous gas. And, this can be implemented by using such a comparatively simple configuration as the holding portion cover and a significant design change is not necessitated. Furthermore, once the exhaust mechanism is operated, air is sucked in through a gap portion between the lower portion of the holding portion cover and the upper surface of the polishing table and the air is exhausted through a pipe provided in the upper portion of the holding portion cover, then a rising air current is formed between the outer surface of the substrate holding portion and the inner surface of the holding portion cover. Accordingly, the gas can be prevented from leaking out through the gap portion in the lower portion of the holding portion cover to the environment, and the gas can be safely exhausted through the pipe in the upper portion of the holding portion cover.

Also, in the above substrate polishing apparatus, the holding portion cover is movable between a covering position at which the holding portion cover comes close to the substrate holding portion to cover the outer side of the substrate holding portion and a non-covering position at which the holding portion is separated from the substrate holding portion and does not cover the outer side of the substrate holding portion, and when a surface to be polished of a substrate is polished, the holding portion cover may be placed at the covering position, and when a surface to be polished of a substrate is not polished, the holding portion cover may be placed at the non-covering position.

According to this configuration, when the holding portion cover is required (when a hazardous gas is generated), the holding portion cover is placed at the used position, so that the hazardous gas can be prevented from diffusing to the environment. On the one hand, when the holding portion cover is not required (when a hazardous gas is not generated), the holding portion cover is placed at the non-used position, so that interference with other components can be prevented.

Also, in the above substrate polishing apparatus, the holding portion cover may be configured to cover the entire circumference of the substrate holding portion.

According to this configuration, the holding portion cover that covers the entire circumference of the substrate holding portion can prevent a hazardous gas from diffusing to the environment. In such a situation, the diffusion of the gas can be prevented throughout the entire circumference without leak.

Also, in the above substrate polishing apparatus, the holding portion cover may be configured to partially cover the circumference of the substrate holding portion.

According to this configuration, the holding portion cover that partially covers the circumference of the substrate holding portion can prevent a hazardous gas from diffusing to the environment. In such a situation, the diffusion of the gas can be partially prevented effectively (only the necessary portion).

Also, in the above substrate polishing apparatus, in the substrate holding portion, a rising air current generating mechanism that generates a rising air current between the outer surface of the substrate holding portion and the inner surface of the holding portion cover due to rotation of the substrate holding portion may be provided.

According to this configuration, once the substrate holding portion rotates, the rising air current generating mechanism generates a rising air current between the outer surface of the substrate holding portion and the inner surface of the holding portion cover. Providing the rising air current generating mechanism in such a manner can assist in forming the rising air current between the outer surface of the substrate holding portion and the inner surface of the holding portion cover.

Furthermore, the above substrate polishing apparatus may further include a table cover that covers the outer side of the polishing table, a second gap portion for intake provided between the polishing table and the table cover, and a second pipe for exhaust connected to the exhaust mechanism and provided in the lower portion of the table cover, and in the polishing table, a descending air current generating mechanism that generates a descending air current between the outer surface of the polishing table and the inner surface of the table cover due to rotation of the polishing table may be provided.

According to this configuration, once the exhaust mechanism is operated, air is sucked in through the second gap portion between the polishing table and the table cover, and the air is exhausted through a pipe provided in the lower portion of the table cover, forming a descending air current between the outer surface of the polishing table and the inner surface of the table cover. The table cover that covers the outer side of the polishing table can prevent a hazardous gas from diffusing to the environment, and the gas can be safely exhausted through the pipe in the lower portion of the table cover. And, in such a situation, once the polishing table rotates, the descending air current generating mechanism generates a descending air current between the outer surface of the polishing table and the inner surface of the table cover. Providing the descending air current generating mechanism in such a manner can assist in forming the descending air current between the polishing table and the table cover.

Also, the above substrate polishing apparatus may further include a shielding mechanism that covers the outer side of the holding portion cover that covers the outer side of the substrate holding portion and the outer side of the polishing table.

According to this configuration, because the shielding mechanism covers the outer side of the holding portion cover (the outer side of the holding portion cover that covers the outer side of the substrate holding portion) and the outer side of the polishing table, a function that prevents a hazardous gas from diffusing to the environment can be improved.

Furthermore, in the above substrate polishing apparatus, the pipe may further include a gas-liquid separating mechanism.

According to this configuration, even if a liquid is mixed into a gas when the gas is sucked in through the gap portion between the lower portion of the holding portion cover and the upper surface of the polishing table, the gas-liquid separating mechanism can separate the gas from the liquid, so that the gas (separated from the liquid) can be appropriately exhausted.

A substrate polishing apparatus of another embodiment includes a rotating polishing table, a substrate holding portion that holds a substrate and presses the substrate against the polishing table to polish the substrate, and a local exhaust mechanism whose intake head is disposed near the substrate holding portion, in which the intake head is disposed on a downstream side of the substrate holding portion in a rotation direction of the polishing table.

According to this configuration, even if a hazardous gas is generated when a substrate is polished, the intake head disposed near the substrate holding portion can suck in the gas effectively. In such a situation, because the intake head is disposed on the downstream side in the rotation direction of the polishing table, the gas made to flow by an air current (swirl flow) generated from rotation of the polishing table can be sucked in effectively. In this way, such a comparatively simple configuration as the intake head can prevent the diffusion of a hazardous gas effectively near the site of generation of the gas and a significant design change is not necessitated.

Also, in the above substrate polishing apparatus, an intake air speed of the intake head may be set to be higher than a rotation speed of the polishing table.

A speed at which a gas is made to flow by an air current (swirl flow) generated from rotation of the polishing table is thought to be about equal to (or not greater than) the rotation speed of the polishing table. In such a situation, because the intake air speed of the intake head is set to be higher than the rotation speed of the polishing table, a gas made to flow by the air current (swirl flow) generated from the rotation of the polishing table can be preferably sucked in depending on the speed at which the gas is made to flow.

Also, in the above substrate polishing apparatus, the intake head includes a plurality of inlets arrayed in a radial direction of the polishing table, in which an intake air speed of the inlet of the plurality of inlets on the outer side in the radial direction may be set to be higher than that of the inlet on the inner side in the radial direction.

According to this configuration, the plurality of inlets of the intake head can suck in a hazardous gas generated when a substrate is polished. Because the rotation speed of the polishing table on the outer side in the radial direction is higher than that on the inner side in the radial direction, the speed at which a gas is made to flow by the air current (swirl flow) generated from the rotation of the polishing table is thought to be higher on the outer side in the radial direction than on the inner side in the radial direction (there is a difference along the radial direction). In such a situation, because the plurality of inlets is arrayed in the radial direction of the polishing table and the intake air speed of the inlet on the outer side in the radial direction is set to be higher than that on the inner side in the radial direction, a gas made to flow by the air current (swirl flow) generated from the rotation of the polishing table can be preferably sucked in depending on a difference in speed at which the gas is made to flow (a difference along the radial direction).

First Embodiment

Now, a substrate polishing apparatus of a first embodiment will be described below with reference to the drawings. In this embodiment, a substrate processing apparatus will be illustrated in which a substrate is polished by using chemical mechanical polishing (CMP).

FIG. 1 is a plan view illustrating a whole configuration of the substrate processing apparatus in this embodiment. As shown in FIG. 1, this substrate processing apparatus includes a housing 1 having an about rectangular shape, in which the inside of the housing 1 is partitioned into a load/unload portion 2, a polishing portion 3 and a cleaning portion 4 by partition walls 1a, 1b. These load/unload portion 2, polishing portion 3 and cleaning portion 4 are each assembled independently. Also, the substrate processing apparatus includes a control portion 5 that controls substrate processing operation.

The load/unload portion 2 includes two or more (four in this embodiment) front load portions 20 on which a wafer cassette that stocks many wafers (substrate) is mounted. These front load portions 20 are disposed adjacent to the housing 1 and arrayed along a width direction of the substrate processing apparatus (direction perpendicular to a longitudinal direction). The front load portion 20 is configured so that an open cassette, an SMIF (Standard Manufacturing Interface) pod or a FOUP (Front Opening Unified Pod) can be mounted thereon. Here, the SMIF and the FOUP are a closed container in which the wafer cassette is housed and whose environment can be kept independently of the external space by using a partition wall for covering the container.

Also, in the load/unload portion 2, a traveling mechanism 21 is laid along the array of the front load portions 20, and on the traveling mechanism 21, two transfer robots (loader) 22 movable along an array direction of the wafer cassette are installed. The transfer robot 22 can move on the traveling mechanism 21 to access the wafer cassette mounted on the front load portion 20. Each transfer robot 22 has two handles one above the other, and the upper hand is used to return a processed wafer to the wafer cassette and the lower hand is used to take out a wafer prior to processing from the wafer cassette, and the upper and lower hands can be used properly and separately. Furthermore, the lower hand of the transfer robot 22 is configured capable of rotating around its shaft center to invert a wafer.

Because the load/unload portion 2 is a region required to be kept at the cleanest state, the inside of the load/unload portion 2 is always maintained at a pressure higher than that of any of the outside of the substrate processing apparatus, the polishing portion 3 and the cleaning portion 4. The polishing portion 3 is the dirtiest region because a slurry is used therein as a polishing solution. Thus, a negative pressure is formed in the polishing portion 3 and the pressure is maintained lower than an inner pressure of the cleaning portion 4. The load/unload portion 2 includes a filter fan unit (not shown) having a clean air filter such as an HEPA filter, an ULPA filter or a chemical filter, and from this filter fan unit, a clean air in which particles, a toxic vapor and a toxic gas are removed always blows out.

The polishing portion 3 is a region where a wafer is polished (flattened out) and includes a first polishing unit 3A, a second polishing unit 3B, a third polishing unit 3C and a fourth polishing unit 3D. These first polishing unit 3A, second polishing unit 3B, third polishing unit 3C and fourth polishing unit 3D, as shown in FIG. 1, are arrayed along the longitudinal direction of the substrate processing apparatus. In the polishing portion 3, a wafer surface (surface to be polished) is polished to remove a metal film formed on the surface to be polished.

As shown in FIG. 1, the first polishing unit 3A includes a polishing table 30A on which a polishing pad 10 having a polishing surface is attached, a top ring 31A that holds a wafer and presses the wafer against the polishing pad 10 on the polishing table 30A to polish the wafer, a polishing solution supply nozzle 32A for supplying a polishing solution and a dressing solution (for example, purified water) to the polishing pad 10, a dresser 33A for dressing the polishing surface of the polishing pad 10, and an atomizer 34A that sprays a mixed fluid of a liquid (for example, purified water)

and a gas (for example, nitrogen gas) or a liquid (for example, purified water) in a mist onto the polishing surface.

Similarly, the second polishing unit 3B includes a polishing table 30B on which the polishing pad 10 is attached, a top ring 31B, a polishing solution supply nozzle 32B, a dresser 33B and an atomizer 34B. Also, the third polishing unit 3C includes a polishing table 30C on which the polishing pad 10 is attached, a top ring 31C, a polishing solution supply nozzle 32C, a dresser 33C and an atomizer 34C. Furthermore, the fourth polishing unit 3D includes a polishing table 30D on which the polishing pad 10 is attached, a top ring 31D, a polishing solution supply nozzle 32D, a dresser 33D and an atomizer 34D.

Because the first polishing unit 3A, the second polishing unit 3B, the third polishing unit 3C and the fourth polishing unit 3D have an identical configuration to each other, the first polishing unit 3A will be described below.

Figure 2:
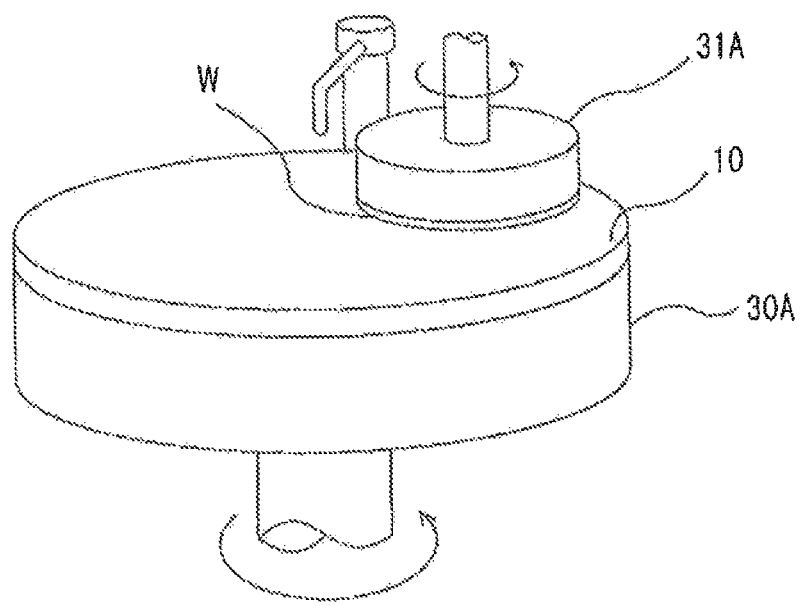
FIG. 2 is a perspective view illustrating a structure of a swing transporter in the first embodiment.

FIG. 2 is a perspective view for schematically illustrating the first polishing unit 3A. The top ring 31A is supported by a top ring shaft. On the upper surface of the polishing table 30A, the polishing pad 10 is stuck, and the upper surface of this polishing pad 10 provides a polishing surface that polishes a wafer W. Note that instead of the polishing pad 10, bonded abrasive grains can be used. The top ring 31A and the polishing table 30A, as shown by the arrows, are configured to rotate around their shaft centers, respectively. A wafer W is held on the lower surface of the top ring 31A by vacuum suction. On polishing, a polishing solution is supplied from the polishing solution supply nozzle 32A to the polishing surface of the polishing pad 10, and the wafer W to be polished is pushed against the polishing surface by the top ring 31A and the wafer is polished.

Next, a transport mechanism for transporting a wafer will be described. As shown in FIG. 1, adjacent to the first polishing unit 3A and the second polishing unit 3B, a first linear transporter 6 is disposed. This first linear transporter 6 is a mechanism that transports a wafer between four transport positions along the direction in which the polishing units 3A, 3B are arrayed (a first transport position TP1, a second transport position TP2, a third transport position TP3 and a fourth transport position TP4 in the order from the load/unload portion side).

Also, adjacent to the third polishing unit 3C and the fourth polishing unit 3D, a second linear transporter 7 is disposed. This second linear transporter 7 is a mechanism that transports a wafer between three transport positions along the direction in which the polishing units 3C, 3D are arrayed (a fifth transport position TP5, a sixth transport position TP6 and a seventh transport position TP7 in the order from the load/unload portion side).

A wafer is transported to the polishing units 3A, 3B by the first linear transporter 6. As stated above, the top ring 31A of the first polishing unit 3A moves between a polishing position and the second transport position TP2 by swing motion of a top ring head. Accordingly, delivery/receipt of a wafer to/from the top ring 31A are carried out at the second transport position TP2. Similarly, the top ring 31B of the second polishing unit 3B moves between a polishing position and the third transport position TP3 and delivery/receipt of a wafer to/from the top ring 31B are carried out at the third transport position TP3. The top ring 31C of the third polishing unit 3C moves between a polishing position and the sixth transport position TP6 and delivery/receipt of a wafer to/from the top ring 31C are carried out at the sixth transport position TP6. The top ring 31D of the fourth polishing unit 3D moves between a polishing position and the seventh transport position TP7 and delivery/receipt of a wafer to/from the top ring 31D are carried out at the seventh transport position TP7.

At the first transport position TP1, a lifter 11 for receiving a wafer from the transfer robot 22 is disposed. A wafer is delivered from the transfer robot 22 to the first linear transporter 6 through this lifter 11. A shutter (not shown) is provided in the partition wall 1a to be situated between the lifter 11 and the transfer robot 22, and on transporting a wafer, the shutter is opened so that the wafer is delivered from the transfer robot 22 to the lifter 11. Also, between the first linear transporter 6, the second linear transporter 7 and the cleaning portion 4, a swing transporter 12 is disposed. This swing transporter 12 has a hand movable between the fourth transport position TP4 and the fifth transport position TP5, and the swing transporter 12 carries out delivery of a wafer from the first linear transporter 6 to the second linear transporter 7. The second linear transporter 7 transports a wafer to the third polishing unit 3C and/or the fourth polishing unit 3D. Also, a wafer polished in the polishing portion 3 is transported to the cleaning portion 4 via the swing transporter 12.

Figure 3A:
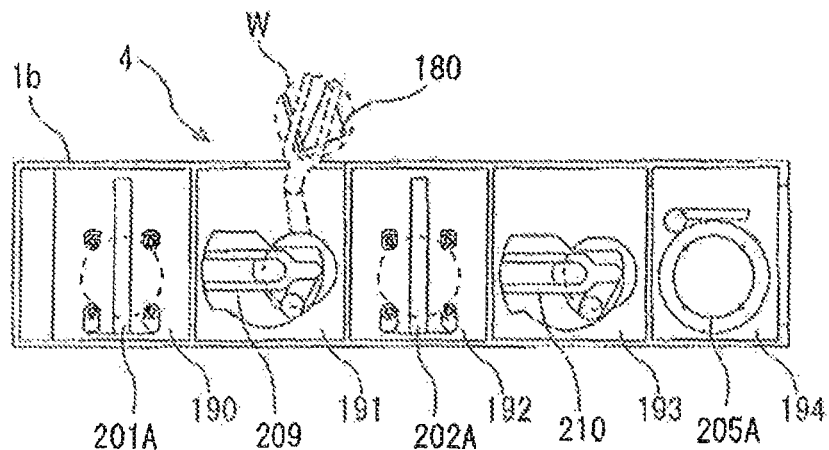
FIG. 3A is a plan view illustrating a cleaning portion in the first embodiment.
Figure 3B:
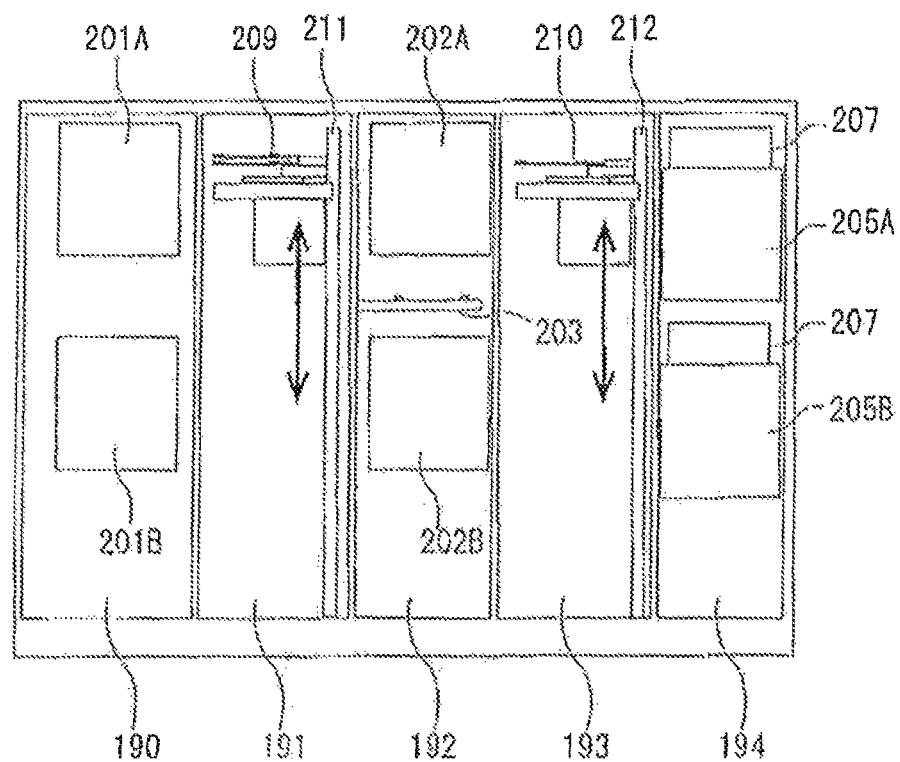
FIG. 3B is a side view illustrating the cleaning portion in the first embodiment.

FIG. 3A is a plan view illustrating the cleaning portion 4 and FIG. 3B is a side view illustrating the cleaning portion 4. In the cleaning portion 4, a wafer W polished in the polishing portion 3 is washed and dried. As shown in FIGS. 3A and 3B, the cleaning portion 4 is partitioned into a first washing room 190, a first transport room 191, a second washing room 192, a second transport room 193 and a drying room 194. In the first washing room 190, an upper primary washing module 201A and a lower primary washing module 201B arrayed along a longitudinal direction are disposed. The upper primary washing module 201A is disposed above the lower primary washing module 201B. Similarly, in the second washing room 192, an upper secondary washing module 202A and a lower secondary washing module 202B arrayed along the longitudinal direction are disposed. The upper secondary washing module 202A is disposed above the lower secondary washing module 202B. The primary and secondary washing modules 201A, 201B, 202A and 202B are a washer that washes a wafer by using a wash solution. These primary and secondary washing modules 201A, 201B, 202A and 202B are arrayed along a vertical direction, providing an advantage that a footprint area is small.

Between the upper secondary washing module 202A and the lower secondary washing module 202B, a temporary placing table 203 for a wafer is provided. In the drying room 194, an upper drying module 205A and a lower drying module 205B arrayed along the longitudinal direction are disposed. These upper drying module 205A and lower drying module 205B are isolated from each other. In the upper portion of the upper drying module 205A and the lower drying module 205B, filter fan units 207, 207 are provided to supply a clean air into the drying modules 205A, 205B, respectively. The upper primary washing module 201A, the lower primary washing module 201B, the upper secondary washing module 202A, the lower secondary washing module 202B, the temporary placing table 203, the upper drying module 205A and the lower drying module 205B are fixed on a frame not shown by using a bolt or the like.

In the first transport room 191, a first transfer robot 209 movable up and down is disposed, and in the second transport room 193, a second transfer robot 210 movable up and down is disposed. The first transfer robot 209 and the second transfer robot 210 are movably supported by support axes 211, 212 extending along a longitudinal direction, respectively. The first transfer robot 209 and the second transfer robot 210 have a drive mechanism such as a motor therein, and are movable up and down along the support axes 211, 212. The first transfer robot 209, similarly to the transfer robot 22, has two hands one above the other. In the first transfer robot 209, as shown by the dashed lines in FIG. 3A, the lower hand is disposed at a position accessible to a temporary placing table 180. When the lower hand of the first transfer robot 209 accesses the temporary placing table 180, a shutter (not shown) provided in the partition wall 1b is opened.

The first transfer robot 209 operates to transport a wafer W between the temporary placing table 180, the upper primary washing module 201A, the lower primary washing module 201B, the temporary placing table 203, the upper secondary washing module 202A and the lower secondary washing module 202B. When a wafer prior to washing (a wafer to which a slurry adheres) is transported, the first transfer robot 209 uses the lower hand to transport it, and when a washed wafer is transported, the upper hand is used. The second transfer robot 210 operates to transport a wafer W between the upper secondary washing module 202A, the lower secondary washing module 202B, the temporary placing table 203, the upper drying module 205A and the lower drying module 205B. The second transfer robot 210 transports only the washed wafer and accordingly has only one hand. The transfer robot 22 shown in FIG. 1 uses its upper hand to take out a wafer from the upper drying module 205A or the lower drying module 205B and returns the wafer to the wafer cassette. When the upper hand of the transfer robot 22 accesses the drying modules 205A, 205B, a shutter (not shown) provided in the partition wall 1a is opened.

Figure 4:
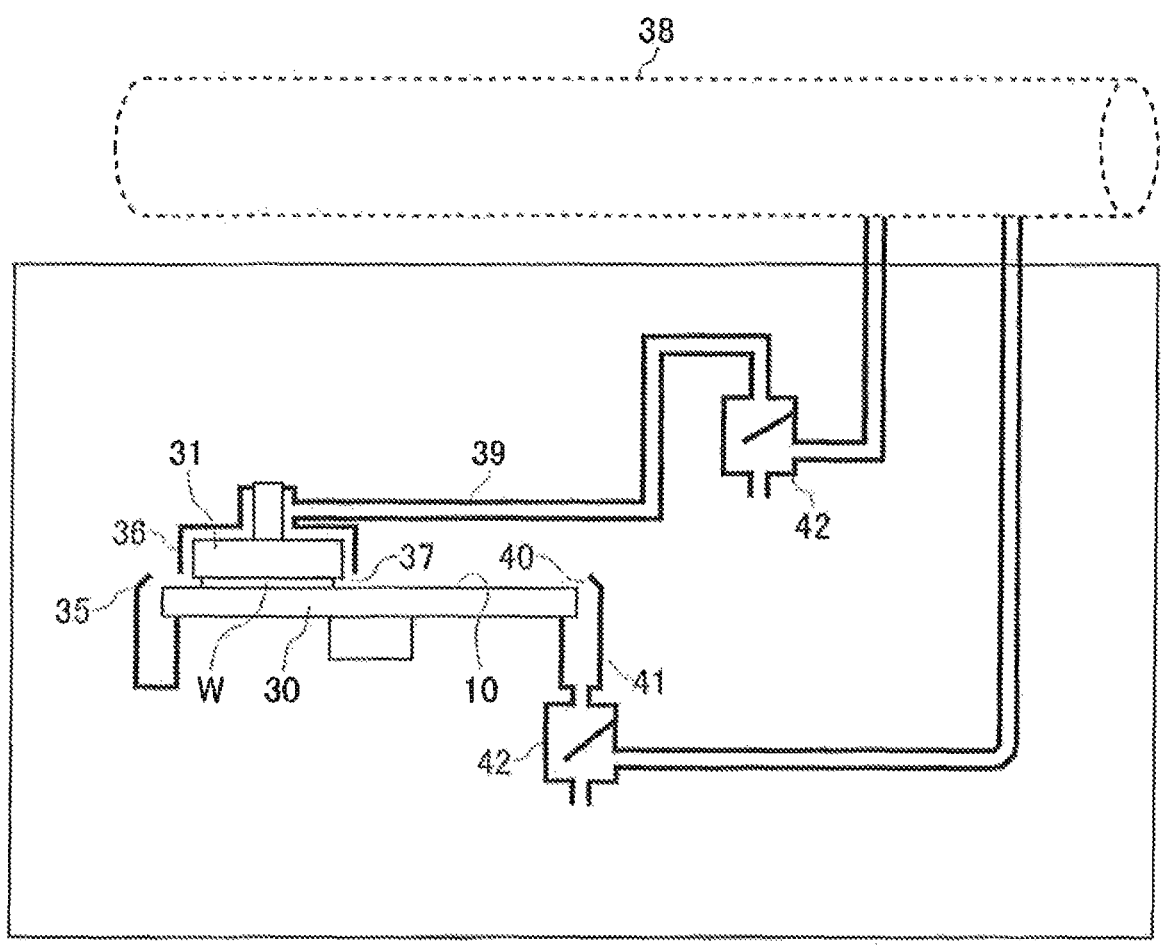
FIG. 4 is an illustration showing a schematic configuration of a substrate polishing apparatus in the first embodiment.

Next, a characteristic configuration of a substrate polishing apparatus of this embodiment will be described with reference to the drawings. FIG. 4 is an illustration showing a schematic configuration of the substrate polishing apparatus of this embodiment and FIG. 5 is an illustration showing a main configuration of the substrate polishing apparatus of this embodiment.

Figure 5:
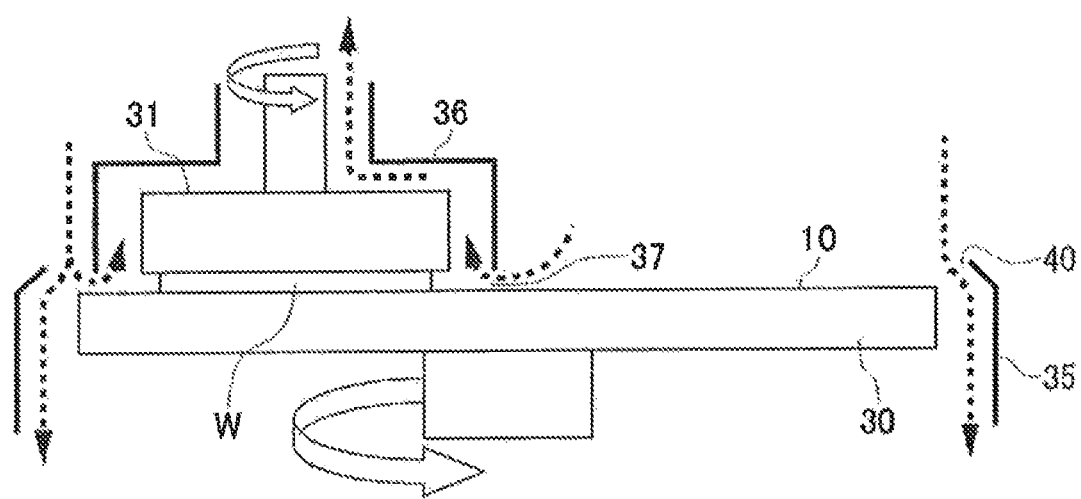
FIG. 5 is an illustration showing a main configuration of the substrate polishing apparatus in the first embodiment.

As shown in FIGS. 4 and 5, the substrate polishing apparatus of this embodiment includes a polishing table 30 having a polishing surface 10 in the upper surface, a table cover 35 that covers the outer side of the polishing table 30, a top ring 31 that holds a wafer W having a surface to be polished in the lower surface and a top ring cover 36 that covers the outer side of the top ring 31. The polishing surface 10 includes, for example, a polishing pad. The top ring 31 presses the surface to be polished of the held wafer W (lower surface in FIGS. 4 and 5) against the polishing surface 10 of the polishing table 30 to polish the surface to be polished of the wafer W.

In such a situation, between the lower portion of the top ring cover 36 and the upper surface of the polishing table 30, a gap portion for intake 37 is provided, and in the upper portion of the top ring cover 36, a pipe for exhaust 39 connected to an exhaust mechanism 38 is provided. By operating the exhaust mechanism 38, a rising air current from the gap portion 37 toward the pipe 39 (upward from below) is formed between the outer surface of the top ring 31 and the inner surface of the top ring cover 36 (see FIG. 5).

Also, between the polishing table 30 and the table cover 35, a second gap portion for intake 40 is provided, and in the lower portion of the table cover 35, a second pipe for exhaust 41 connected to the exhaust mechanism 38 is provided. By operating the exhaust mechanism 38, a descending air current downward from above is formed between the polishing table 30 and the table cover 35 (see FIG. 5).

Note that the pipe for exhaust 39 may be connected to a duct having an exhaust function, and also the pipe for exhaust 39 may be provided with a blower driven by an electric motor or the like. That is, as the exhaust mechanism 38, the duct having an exhaust function or the blower driven by an electric motor or the like can be used. Also, the pipe for exhaust 39 includes a gas-liquid separating mechanism 42 (see FIG. 4). Note that also the second pipe 41 may include the gas-liquid separating mechanism 42.

The top ring cover 36 may be movable between a covering position (position at which the top ring cover 36 comes close to the top ring 31 to cover the circumference of the top ring 31) and a non-covering position (position at which it is separated from the top ring 31 and does not cover the circumference of the top ring 31). When a surface to be polished of a wafer W is polished (when exhaust is required), the top ring cover 36 is placed at a used position to exhaust a generated gas effectively. On the one hand, when a surface to be polished of a wafer W is not polished (for example, when exhaust is not required, such as when the top ring 31 is moved), the top ring cover 36 is placed at a non-used position, allowing interference with the top ring 31 to be avoided.

Figure 6A:
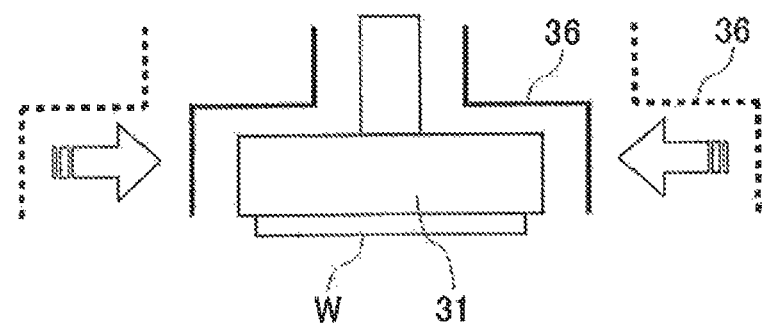
FIGS. 6A and 6B are views illustrating examples of a holding portion cover in the first embodiment.
Figure 6B:
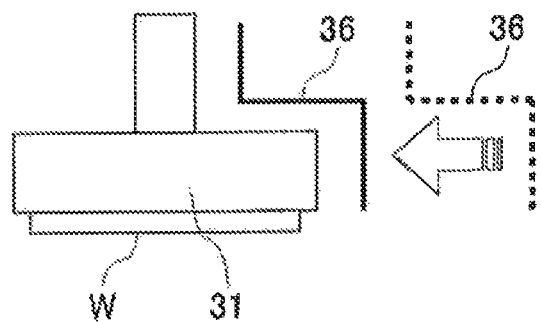

FIGS. 6A and 6B are views illustrating examples of the top ring cover 36 in this embodiment. As shown in FIG. 6A, the top ring cover 36 can be configured to cover the entire circumference of the top ring 31 when the top ring cover 36 is placed at the covering position. In such a situation, a cover shape of the top ring cover 36 is split so that the entire circumference can be easily covered. Alternatively, as shown in FIG. 6B, the top ring cover 36 can be configured to partially cover the circumference of the top ring 31 when the top ring cover 36 is placed at the covering position. For example, when a swirl flow is generated above the polishing table 30, only in the portion corresponding to the downstream of the gas flow, the top ring cover 36 may be provided.

Figure 7A:
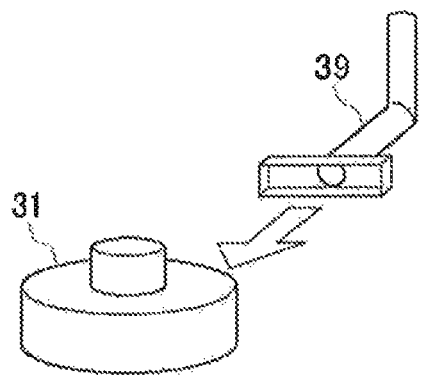
FIGS. 7A-7D are views illustrating examples of an inlet of a pipe for exhaust in the first embodiment.
Figure 7B:
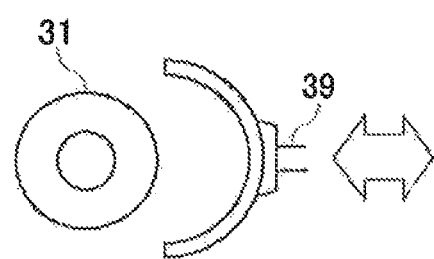
Figure 7C:
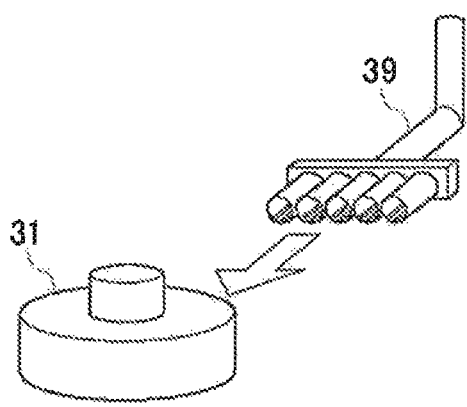
Figure 7D:
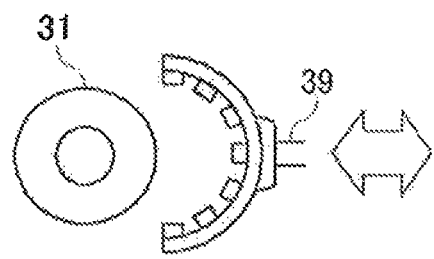

FIGS. 7A-7D are views illustrating examples of an inlet of the pipe for exhaust 39 in this embodiment. As shown in FIG. 7A, the inlet of the pipe for exhaust 39 may have a box-like shape. Also, as shown in FIG. 7B, the inlet of the pipe for exhaust 39 may have a shape that fits the outer circumference of the top ring 31. Furthermore, as shown in FIG. 7C, the inlet of the pipe for exhaust 39 may have a box-like shape formed by coupling a plurality of cylindrical components with each other. Also, as shown in FIG. 7D, the inlet of the pipe for exhaust 39 may have both of a shape formed by coupling a plurality of cylindrical components with each other and a shape that fits the outer circumference of the top ring 31.

Figure 8:
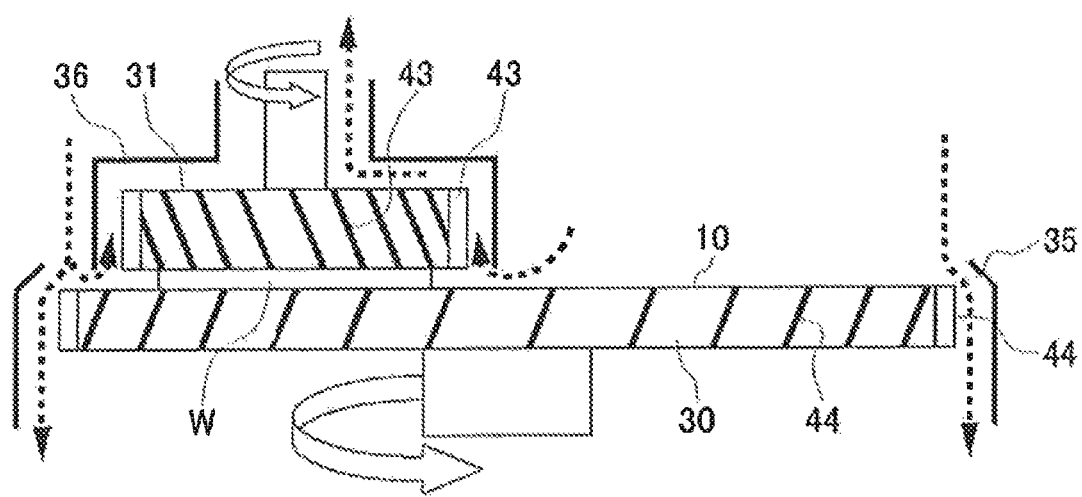
FIG. 8 is a view illustrating a configuration of an air current generating mechanism in the first embodiment.
Figure 9A:
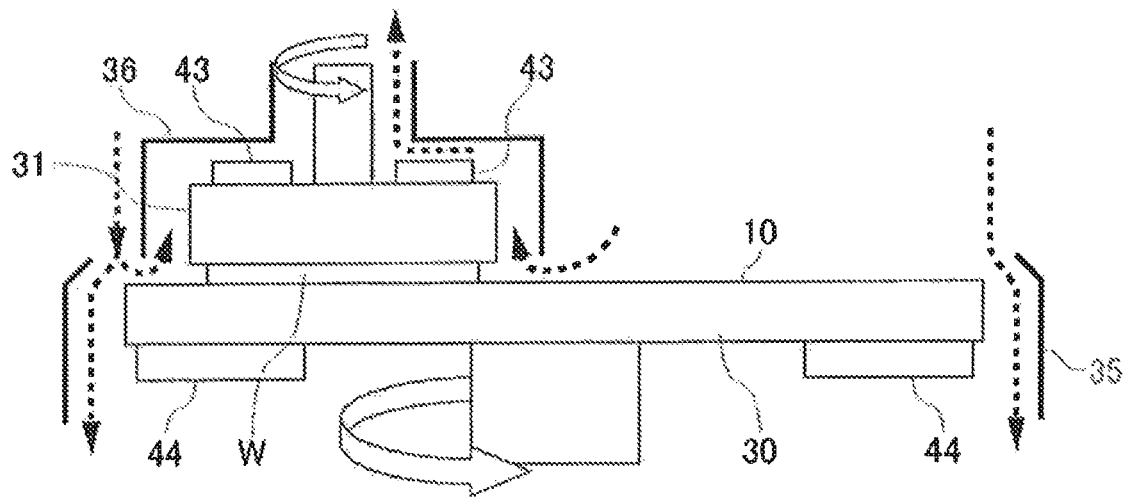
FIGS. 9A and 9B are views illustrating examples of the air current generating mechanism in the first embodiment.
Figure 9B:
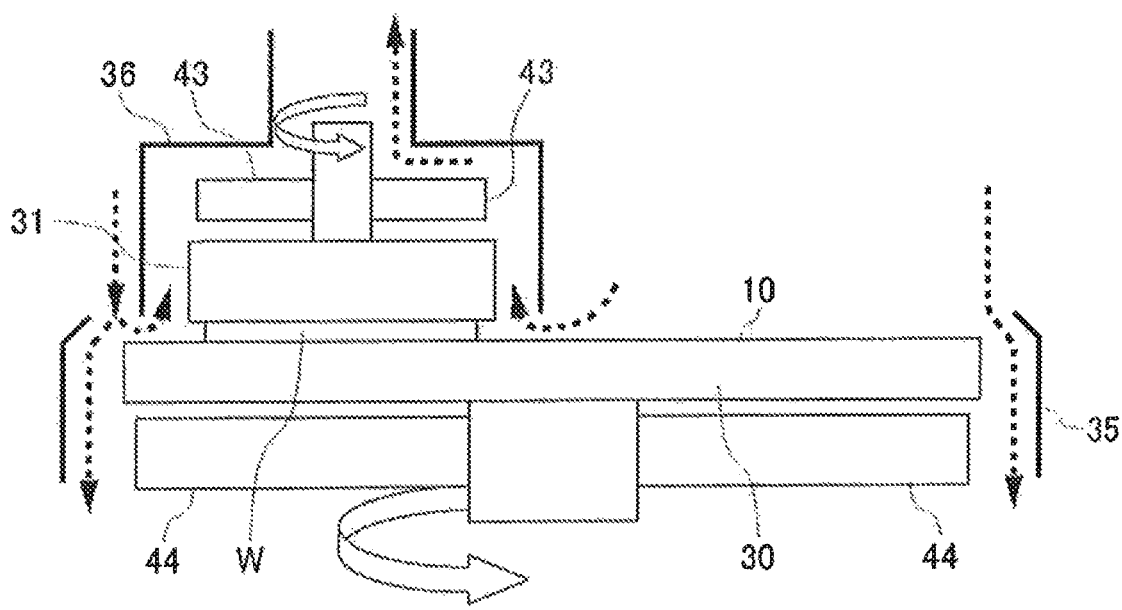

FIGS. 8, 9A and 9B are views illustrating examples of an air current generating mechanism in this embodiment. As shown in FIGS. 8, 9A and 9B, the top ring 31 includes a rising air current generating mechanism 43 that generates a rising air current between the outer surface of the top ring 31 and the inner surface of the top ring cover 36 due to rotation of the top ring 31. Also, the polishing table 30 includes a descending air current generating mechanism 44 that generates a descending air current between the outer surface of the polishing table 30 and the inner surface of the table cover 35 due to rotation of the polishing table 30.

The air current generating mechanisms (rising air current generating mechanism 43 and descending air current generating mechanism 44) are, for example, a blade mechanism including a fin, a thread groove, or the like. The rising air current generating mechanism 43 may be provided in the outer peripheral surface of the top ring 31 (see FIG. 8). Also, the rising air current generating mechanism 43 may be provided in the upper surface of the top ring 31 (see FIG. 9A), or on a rotation axis of the top ring 31. Similarly, the descending air current generating mechanism 44 may be provided in the outer peripheral surface of the polishing table 30 (see FIG. 8). Also, the descending air current generating mechanism may be provided in the lower surface of the polishing table 30 (see FIG. 9A), or on a rotation axis of the polishing table 30 (see FIG. 9B).

Note that the top ring cover 36 may be rotatable independently of the top ring 31, and in the inner peripheral surface of the top ring cover 36, the rising air current generating mechanism 43 may be provided, but not shown here. Similarly, the table cover 35 may be rotatable independently of the polishing table 30, and in the inner peripheral surface of the table cover 35, the descending air current generating mechanism 44 may be provided.

Figure 10:
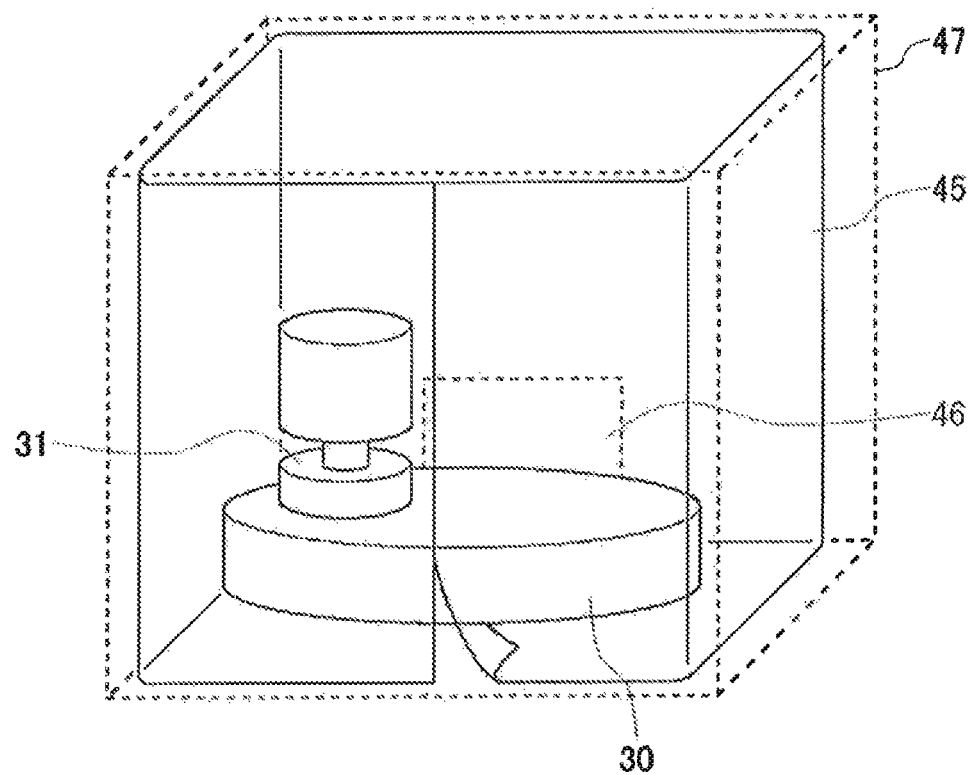
FIG. 10 is a view illustrating a configuration of a shielding mechanism in the first embodiment.
Figure 11A:
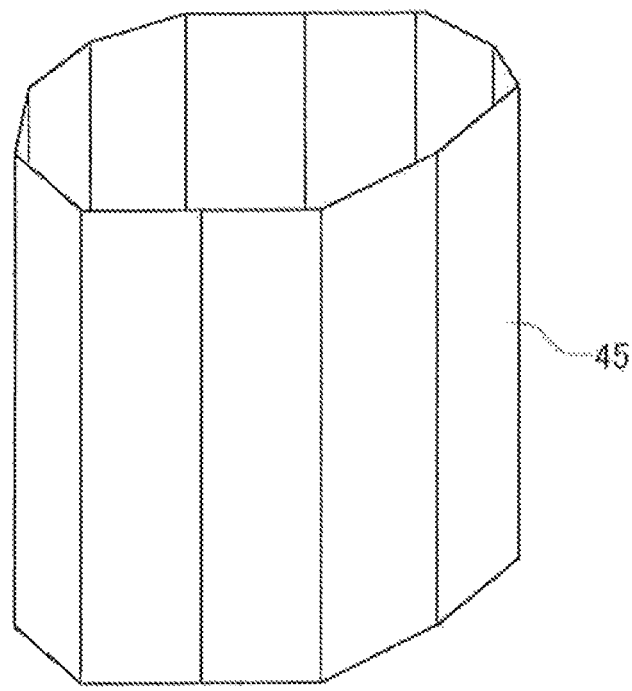
FIGS. 11A and 11B are views illustrating examples of the shielding mechanism in the first embodiment.
Figure 11B:
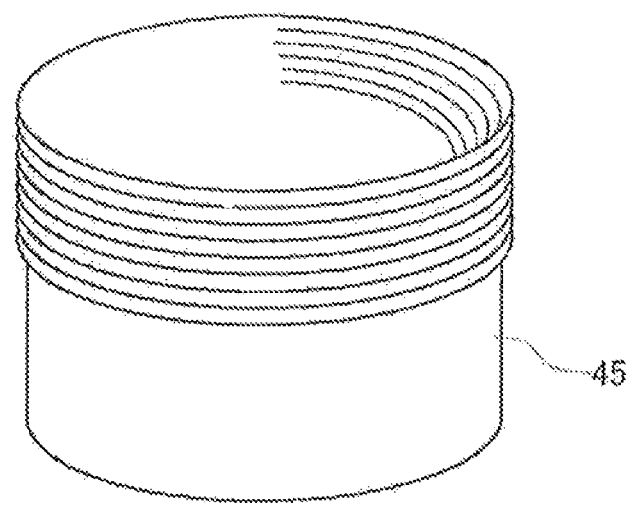

FIGS. 10, 11A and 11B are views illustrating examples of a shielding mechanism 45 in this embodiment. As shown in FIG. 10, the shielding mechanism 45 is configured to cover the outer side of the top ring cover 36 (the outer side of the top ring 31) and the outer side of the polishing table 30. This shielding mechanism 45 is disposed between a POS room wall and a maintenance door 47, and the top ring 31 and the polishing table 30. In the shielding mechanism 45, an operable opening portion 46 is provided so that carry-in/carry-out of a wafer W and maintenance are not blocked. Note that the shielding mechanism 45 is installed so as not to block another opening portion provided in the POS room (another opening portion for carry-in/carry-out of a wafer W and maintenance, not shown). When a contaminant adheres to the inner surface of the shielding mechanism 45, if the shielding mechanism 45 is put away so that the inner surface of the shielding mechanism 45 is covered, then the contaminated surface can be prevented from being exposed to a maintenance worker.

For example, the shielding mechanism 45 can be a vinyl curtain having a height from a ceiling surface of the POS room to a floor surface (see FIG. 10). Also, the shielding mechanism 45 can be panels or bellows deployable at the point of use (see FIGS. 11A and 11B). It is desirable that a material of the shielding mechanism 45 should have transparence allowing the inside to be seen from the outside and not be changed easily and chemically by a slurry or a work material. For example, as an example of the material for the shielding mechanism 45, PVC is used.

According to the substrate polishing apparatus of such an embodiment, by suppressing the diffusion of a generated gas at the site of generation and exhausting it effectively, the diffusion of a hazardous substance can be prevented with a small design change and a reduced load on customers. That is, according to this embodiment, even if a hazardous gas is generated between the polishing surface 10 of the polishing table 30 and a surface to be polished of a wafer W when the wafer W is polished, then the top ring cover 36 that covers the outer side of the top ring 31 can prevent the hazardous gas from diffusing from the site of generation to the environment.

In such a situation, as shown in FIG. 5, the gas diffusion can be prevented effectively near the site of generation of a hazardous gas. And, this can be implemented by such a comparatively simple configuration as the top ring cover 36 and a large-scaled design change is not necessitated. Furthermore, by operating the exhaust mechanism 38, air is sucked in through the gap portion 37 between the lower portion of the top ring cover 36 and the upper surface of the polishing table 30, the air is exhausted through the pipe 39 provided in the upper portion of the top ring cover 36 and a rising air current is formed between the outer surface of the top ring 31 and the inner surface of the top ring cover 36. Accordingly, a gas can be prevented from leaking out through the gap portion 37 in the lower portion of the top ring cover 36 to the environment and the gas can be safely exhausted through the pipe 39 in the upper portion of the top ring cover 36.

Also, by operating the exhaust mechanism 38, air is sucked in through the second gap portion 40 between the polishing table 30 and the table cover 35, the air is exhausted through the second pipe 41 provided in the lower portion of the table cover 35 and a descending air current is formed between the outer surface of the polishing table 30 and the inner surface of the table cover 35. The table cover 35 that covers the outer side of the polishing table 30 can prevent the diffusion of a hazardous gas to the environment and the gas can be safely exhausted through the second pipe 41 in the lower portion of the table cover 35.

Furthermore, in this embodiment, as shown in FIG. 6, when the top ring cover 36 is required (when a hazardous gas is generated), the top ring cover 36 is placed at the used position and the hazardous gas can be prevented from diffusing to the environment. On the one hand, when the top ring cover 36 is not required (when a hazardous gas is not generated), the top ring cover 36 is placed at the non-used position, allowing interference with other components to be prevented.

For example, as shown in FIG. 6A, the top ring cover 36 that covers the entire circumference of the top ring 31 can prevent a hazardous gas from diffusing to the environment. In such a situation, the gas can be prevented from diffusing throughout the entire circumference without leak.

Alternatively, as shown in FIG. 6B, the top ring cover 36 that partially covers the circumference of the top ring 31 can prevent a hazardous gas from diffusing to the environment. In such a situation, the diffusion of a gas can be prevented partially and effectively (only the required portion).

Furthermore, in this embodiment, as shown in FIG. 8, once the top ring 31 rotates, a rising air current is generated between the outer surface of the top ring 31 and the inner surface of the top ring cover 36 by the rising air current generating mechanism 43. Providing the rising air current generating mechanism 43 in such a manner can assist in forming the rising air current between the outer surface of the top ring 31 and the inner surface of the top ring cover 36.

Also, in such a situation, once the polishing table 30 rotates, a descending air current is generated between the outer surface of the polishing table 30 and the inner surface of the table cover 35 by the descending air current generating mechanism 44. Providing the descending air current generating mechanism 44 in such a manner can assist in forming the descending air current between the polishing table 30 and the table cover 35.

Furthermore, in this embodiment, as shown in FIG. 10, the shielding mechanism 45 covers the outer side of the top ring cover 36 (the outer side of the top ring cover 36 that covers the outer side of the top ring 31) and the outer side of the polishing table 30, so that a function that prevents the diffusion of a hazardous gas to the environment can be improved.

Additionally, in this embodiment, as shown in FIG. 4, because the gas-liquid separating mechanism 42 is provided in the pipe for exhaust 39, even if a liquid is mixed into a gas when the gas is sucked in through the gap portion 37 between the lower portion of the top ring cover 36 and the upper surface of the polishing table 30, then the liquid can be separated from the gas by the gas-liquid separating mechanism 42, so that the gas can be appropriately exhausted (separated from the liquid).

Second Embodiment

Figure 12:
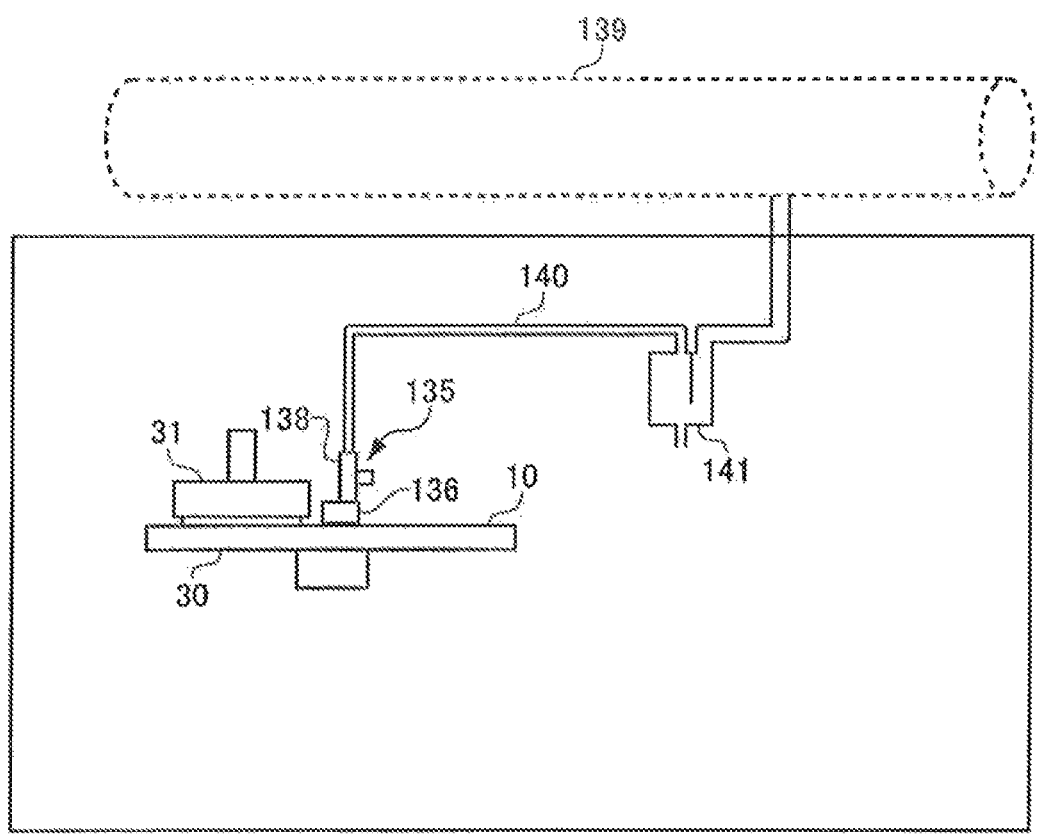
FIG. 12 is an illustration showing a schematic configuration of a substrate polishing apparatus in a second embodiment.

Next, a characteristic configuration of a substrate polishing apparatus of a second embodiment will be described with reference to the drawings. FIG. 12 is an illustration showing a schematic configuration of the substrate polishing apparatus of this embodiment and FIGS. 13 and 14 are illustrations showing a main configuration of the substrate polishing apparatus of this embodiment.

Figure 13:
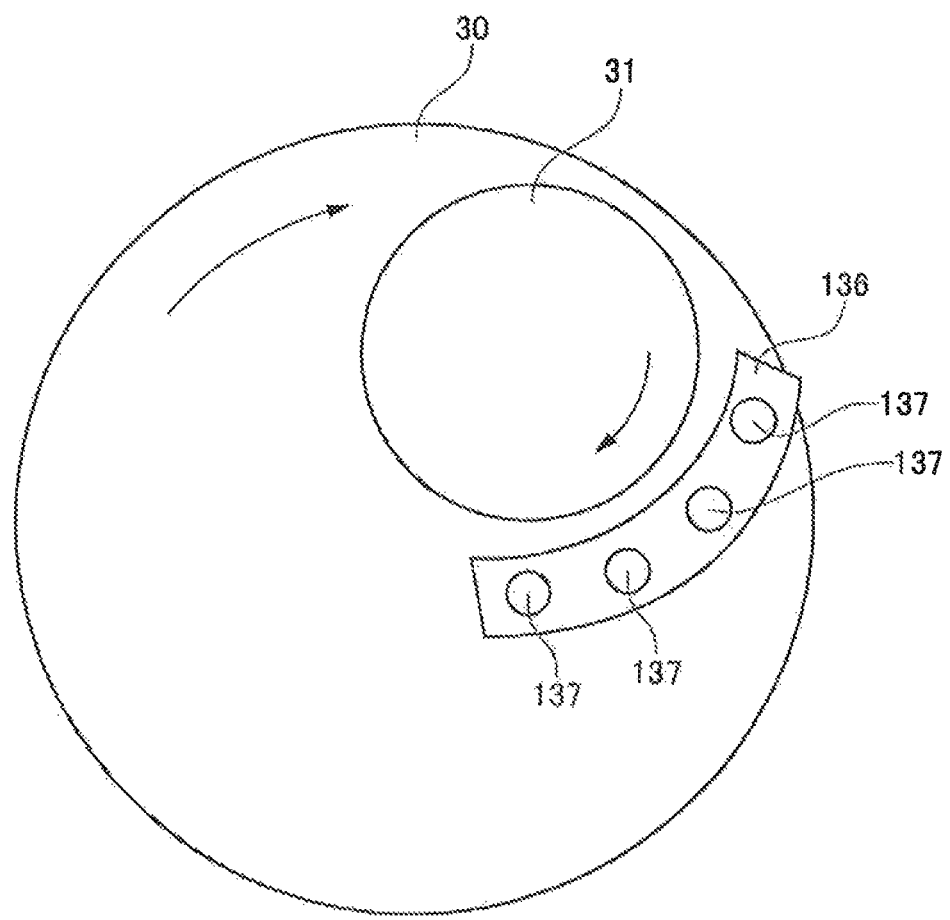
FIG. 13 is a plan view illustrating a main configuration of the substrate polishing apparatus in the second embodiment.
Figure 14:
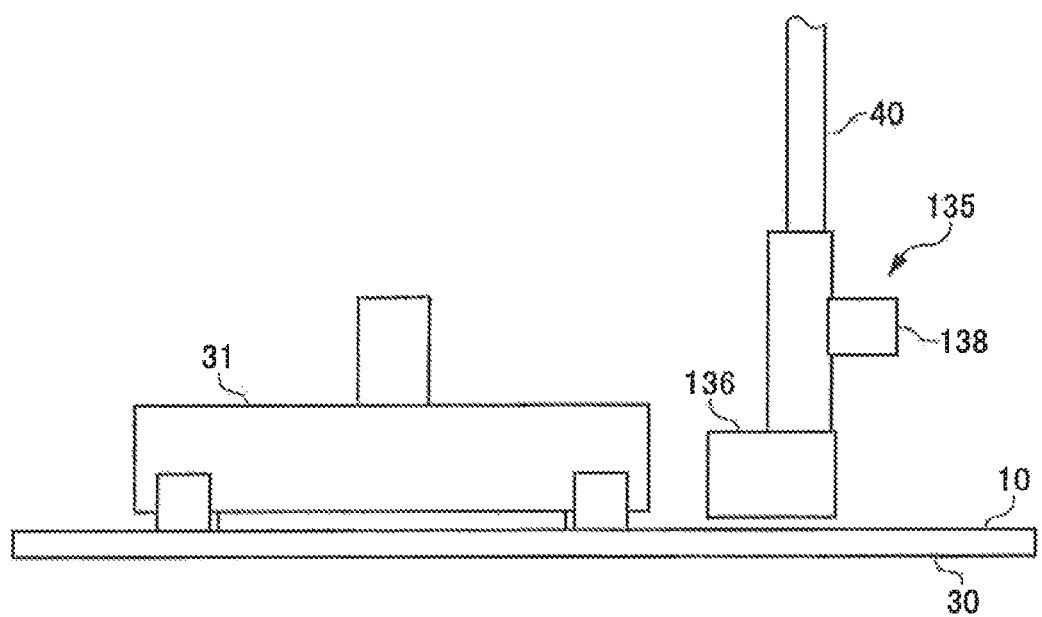
FIG. 14 is a side view illustrating the main configuration of the substrate polishing apparatus in the second embodiment.

As shown in FIGS. 12 to 14, the substrate polishing apparatus of this embodiment includes a polishing table 30 having a polishing surface 10 in the upper surface, a top ring 31 that holds a wafer W having a surface to be polished in the lower surface and a local exhaust mechanism 135 disposed near the top ring 31. The polishing surface 10 includes, for example, a polishing pad. The polishing table 30 rotates in a predetermined rotation direction (clockwise rotation in FIG. 13) and the top ring 31 presses the surface to be polished of the held wafer W (the lower surface in FIGS. 12 and 14) against the polishing surface 10 of the polishing table 30 to polish the surface to be polished of the wafer W. Note that the substrate polishing apparatus may include a table cover that covers the outer side of the polishing table 30 and a top ring cover that covers the outer side of the top ring 31.

As shown in FIG. 13, the local exhaust mechanism 135 includes an intake head 136 disposed near the top ring 31. The intake head 136 is disposed on the downstream side of the top ring 31 in a rotation direction of the polishing table 30 (on the rotation direction side). Also, the intake head 136 includes a plurality of inlets 137 arrayed in a radial direction of the polishing table 30.

As shown in FIG. 14, the inlets 137 of the intake head 136 are connected to an ejector 138 and by forcing a compressed air to flow into the ejector 138, air is sucked in through the inlet 137. The ejector 138 is configured so that adjusting a flow rate of the compressed air allows an intake air speed of the inlet 137 to be adjusted. In such a situation, the intake air speed of the inlet 137 of the plurality of inlets 137 on the outer side in the radial direction is set to be higher than that of the inlet 137 on the inner side in the radial direction (see FIG. 13). Note that an intake means from the inlet 137 is not limited to the ejector 138, but, for example, a vacuum pump or the like may be used as the means.

An intake air speed of the intake head 136 is preferably set to be higher than the rotation speed of the polishing table 30. That is, the intake air speed of the intake head 136 is set to be one or more times the rotation speed of the polishing table 30 (for example, 1 to 2 m/s). For example, the intake air speed of the intake head 136 is set to be 1.2 to 2 times the rotation speed of the polishing table 30. The intake air speed of the intake head 136 can be set based on the rotation speed of the polishing table and a reference area. The reference area is calculated from the product of a diameter and a reference height of a wafer W. The reference height may be set based on a distance between the top ring 31 and the intake head 136. For example, the reference height is set to be 0.3 to 3 times the distance between the top ring 31 and the intake head 136. Also, the reference height may be set based on a height from the polishing surface 10 to an upper end of an opening of the top ring 31 (an upper end of a gap of a retainer ring). For example, the reference height is set to be 1 to 3 times the height from the polishing surface 10 to the upper end of the opening of the top ring 31 (the upper end of the gap of the retainer ring).

Note that, as shown in FIG. 12, the local exhaust mechanism 135 includes a pipe for exhaust 140 connected to an exhaust mechanism 139. Note that the pipe for exhaust 140 may be connected to a duct having an exhaust function, or include a blower driven by an electric motor or the like. Also, in the pipe for exhaust 140, a gas-liquid separating mechanism 141 is provided. In such a situation, because the gas-liquid separating mechanism 141 is provided in the pipe for exhaust 140, even if a liquid is mixed into a gas when the gas is sucked in, then the gas-liquid separating mechanism 141 can separate the liquid from the gas, and the gas sucked in (separated from the liquid) can be appropriately exhausted. Note that between the gas-liquid separating mechanism 141 and the exhaust mechanism 139, a damper may be provided.

According to the substrate polishing apparatus of such an embodiment of the invention, even if a hazardous gas is generated when a wafer W is polished, the gas diffusion can be effectively prevented near the site of generation of the hazardous gas.

That is, in this embodiment, even if a hazardous gas is generated when a wafer W is polished, the intake head 136 disposed near the top ring 31 can effectively suck in the gas. In such a situation, because the intake head 136 is disposed on the downstream side in a rotation direction of the polishing table 30 (on the rotation direction side), a gas made to flow by an air current (swirl flow) generated from rotation of the polishing table 30 can be effectively sucked in. As described, such a comparatively simple configuration as the intake head 136 can effectively prevent the gas diffusion near the site of generation of a hazardous gas without requiring a large-scaled design change.

A speed at which a gas is made to flow by the air current (swirl flow) generated from the rotation of the polishing table 30 is thought to be about equal to (or not greater than) the rotation speed of the polishing table 30. In such a situation, the intake air speed of the intake head 136 is set to be higher than the rotation speed of the polishing table 30, so that a gas made to flow by the air current (swirl flow) generated from the rotation of the polishing table 30 can be preferably sucked in depending on the speed at which the gas is made to flow.

Also, in this embodiment, the plurality of inlets 137 of the intake head 136 can suck in a hazardous gas generated when a wafer W is polished. Because the rotation speed of the polishing table 30 is higher on the outer side in the radial direction than on the inner side, the speed at which a gas is made to flow by the air current (swirl flow) generated from the rotation of the polishing table is thought to be higher on the outer side in the radial direction than on the inner side (there is a difference along the radial direction). In such a situation, the plurality of inlets 137 is arrayed in the radial direction of the polishing table 30 and the intake air speed of the inlet 137 on the outer side in the radial direction is set to be higher than that on the inner side, so that a gas made to flow by the air current (swirl flow) generated from the rotation of the polishing table 30 can be preferably sucked in depending on a difference in speed at which the gas is made to flow (difference along the radial direction).

Figure 15:
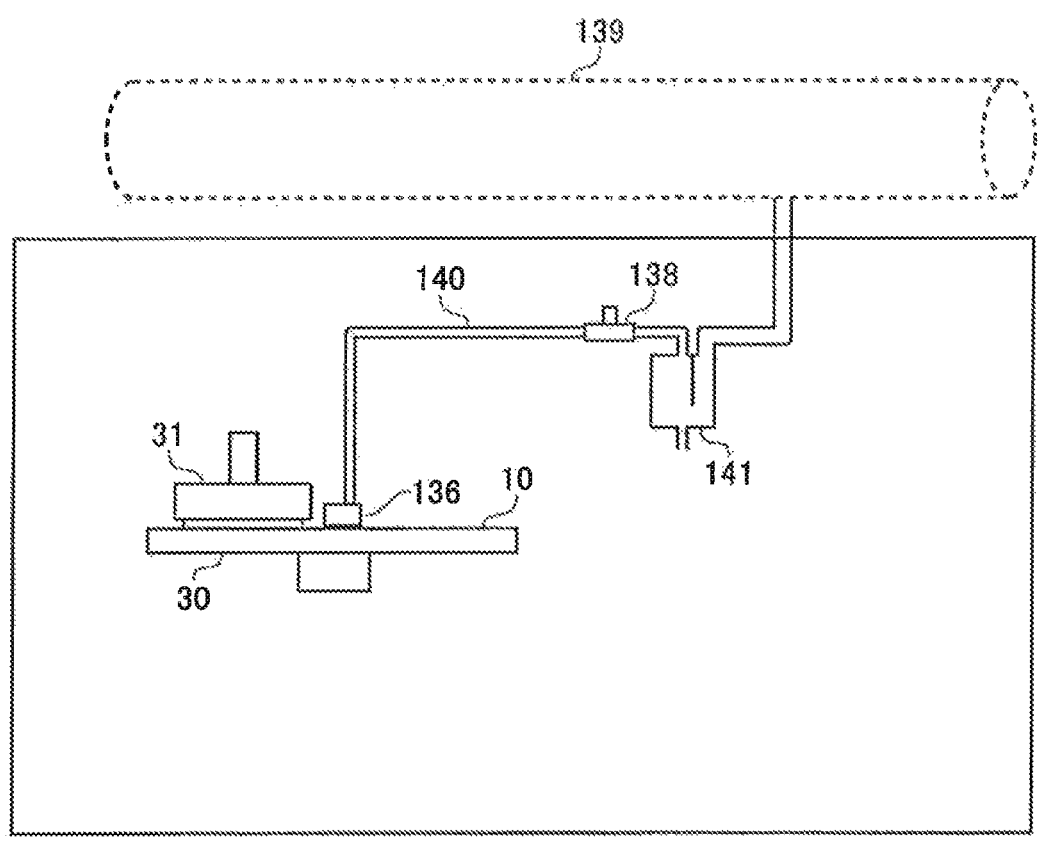
FIG. 15 is an illustration showing a schematic configuration of an example of variation of the second embodiment.

Conventionally, an exhaust velocity around a polishing table is set to be an approximate speed at which a gas is not curled up by an air current generated from rotation of the polishing table and can be smoothly exhausted (for example, about 0.3 m/s). In contrast, a rotation speed of the polishing table (speed in the circumferential direction) is usually 1 to 2 m/s. In such a conventional exhaust velocity, if a hazardous gas is generated on polishing, then the gas diffuses over the polishing table at a rotation speed of the polishing table (the speed higher than the exhaust velocity) and it may become easy for the gas to diffuse evaporatively from the polishing table surface. Additionally, the conventional substrate polishing apparatus adopts, for example, a configuration in which a cover is provided around the polishing table and air is exhausted from the circumference of the polishing table through a usual exhaust line, but if, by any chance, the usual exhaust line stops functioning, exhaust may be not carried out. In contrast, in this embodiment, the ejector 138 is adopted as the local exhaust mechanism 135, so that a suction function higher than the conventional function (exhaust is performed by the usual exhaust line) can be provided. Furthermore, in this embodiment, as long as the ejector 138 is supplied with a compressed air, even if the usual exhaust line stops functioning, then a local exhaust above the polishing table can be implemented, so that safety around the equipment can be ensured. Note that, as shown in FIG. 15, the ejector 138 may be provided at a position separated from the intake head 136.

Note that, in the above description, an example has been described in which the intake air speed of the intake head 136 is set to be higher than the rotation speed of the polishing table 30, but the intake air speed of the intake head 136 may be set to be slightly lower than the rotation speed of the polishing table 30. That is, the intake air speed of the intake head 136 may be set to be one or less times the rotation speed of the polishing table 30. For example, the intake air speed of the intake head 136 may be set to be 0.8 times the rotation speed of the polishing table 30.

Third Embodiment

This embodiment relates to an exhaust volume of a wafer polishing room in a CMP apparatus and a polishing pad temperature. Temperatures of a polishing pad surface and a polishing solution that covers the pad surface (hereinafter, called a "slurry") increase because of thermal energy input caused by a polishing load. This embodiment relates to a mechanism/apparatus that lowers, or manages and controls these temperatures.

Conventionally, in order to remove heat from the pad surface and the slurry to lower the temperature, for example, (1) a mechanism/apparatus in which a cooling plate is laid on the pad surface to remove heat by heat conduction, and (2) a mechanism/apparatus in which a dry gas is sprayed onto the pad surface to remove heat by latent heat of vaporization have been adopted.

For methods to increase a polishing rate, it is thought, for example, that a polishing surface pressure is increased, or a relative speed of the polishing surface is increased. However, doing so increases loss energy due to friction of the polishing surface and the energy is input to the polishing pad, the slurry, a wafer of a product to be polished and a top ring that holds the wafer, causing respective temperatures to increase.

As for the slurry, it can be expected that the polishing rate increases due to polishing (etching) performed by a chemical performance of the slurry provided from an increase in temperature. But, if the temperature becomes too high, the performance of the slurry deteriorates and the proper polishing performance may not be exerted. Also as for the pad, when the temperature goes high, a hardness and a Young's modulus of the pad lower, which may cause deterioration of a flatness of the wafer surface to be polished of a product to be polished. Also, as for the top ring that holds a wafer, if an increase in temperature is high, there is an effect on a mechanism that presses the wafer against the pad. Therefore, it has been strongly desired to be able to manage and control an increase in temperature caused from polishing.

Therefore, the contact heat conduction system (1) and the latent heat of vaporization system by spraying a dry gas (2) pointed out previously have been developed.

However, in the conventional cooling plate system (1), the cooling plate contacts with the pad and the slurry in contact with a wafer to be polished. Thus, contamination from the cooling plate (ions, particles) is worried about, and a cleaning apparatus for a coating portion and a contact portion becomes necessary. Furthermore, also there is concern over a scratch problem with a wafer surface caused from dropping of the slurry that adheres to the cooling plate and a cleaning apparatus for the whole cooling plate becomes necessary. Accordingly, the apparatus itself may become large-scaled. Additionally, because heat is removed by contact heat conduction, the system is proportional to a contact area and a temperature difference, accordingly a wide area and a large temperature difference become necessary. But, because, in a polishing pad surface, a top ring that holds a wafer, a dresser that dresses a pad, a slurry nozzle that supplies a slurry, an atomizer nozzle that washes the pad surface (high-pressure purified water shower nozzle), or the like are provided, the contact area cannot be ensured as intended.

Thus, a system in which a dry gas (air or $N_2$) is sprayed onto a wet pad surface to remove heat by latent heat of vaporization (2) has also been adopted to some degree. However, the sprayed dry gas causes a slurry to fly apart, so that a component of the slurry effective for polishing may be decreased. Also, the slurry that flies apart adheres to the environment and the adherent slurry may drop to cause a scratch problem with a wafer surface. As described, the conventional system (2) has a problem difficult to solve and lacks a general versatility, thus its applicable scope has been narrow.

A substrate polishing apparatus of this embodiment includes a substrate holding portion that holds a substrate and presses the substrate against a polishing table to polish the substrate, a pad cooling nozzle for cooling a polishing pad that polishes a substrate, and a local exhaust mechanism whose intake head is disposed near the pad cooling nozzle, in which the intake head is disposed on the downstream side of the pad cooling nozzle in a rotation direction of the polishing table.

This configuration provides a substrate polishing apparatus (CMP apparatus) in which a hazardous gas and a defect source generated on the polishing table are positively collected and removed, and simultaneously the polishing pad is cooled by the pad cooling nozzle. In such a situation, the local exhaust mechanism can locally exhaust a gas sprayed from the pad cooling nozzle.

Also, the substrate polishing apparatus of this embodiment further includes a second local exhaust mechanism whose second intake head is disposed near the substrate holding portion, in which the second intake head may be disposed on the downstream side of the substrate holding portion in the rotation direction of the polishing table.

According to this configuration, the second local exhaust mechanism can exhaust a hazardous gas and a defect source generated near the substrate holding portion.

According to this configuration, the problem with the conventional dry gas spraying system (2) can be solved, the phenomenon of latent heat of vaporization can be utilized, heat can be removed from the polishing pad, a slurry that covers the polishing pad surface and a top ring that holds a wafer and an increase in their temperatures can be managed and controlled. Therefore, a good flatness of a surface to be polished can be provided and a polishing process can be implemented in a temperature region where a performance of the slurry can be brought out. Thus, the productivity of the CMP apparatus can be improved.

Figure 16:
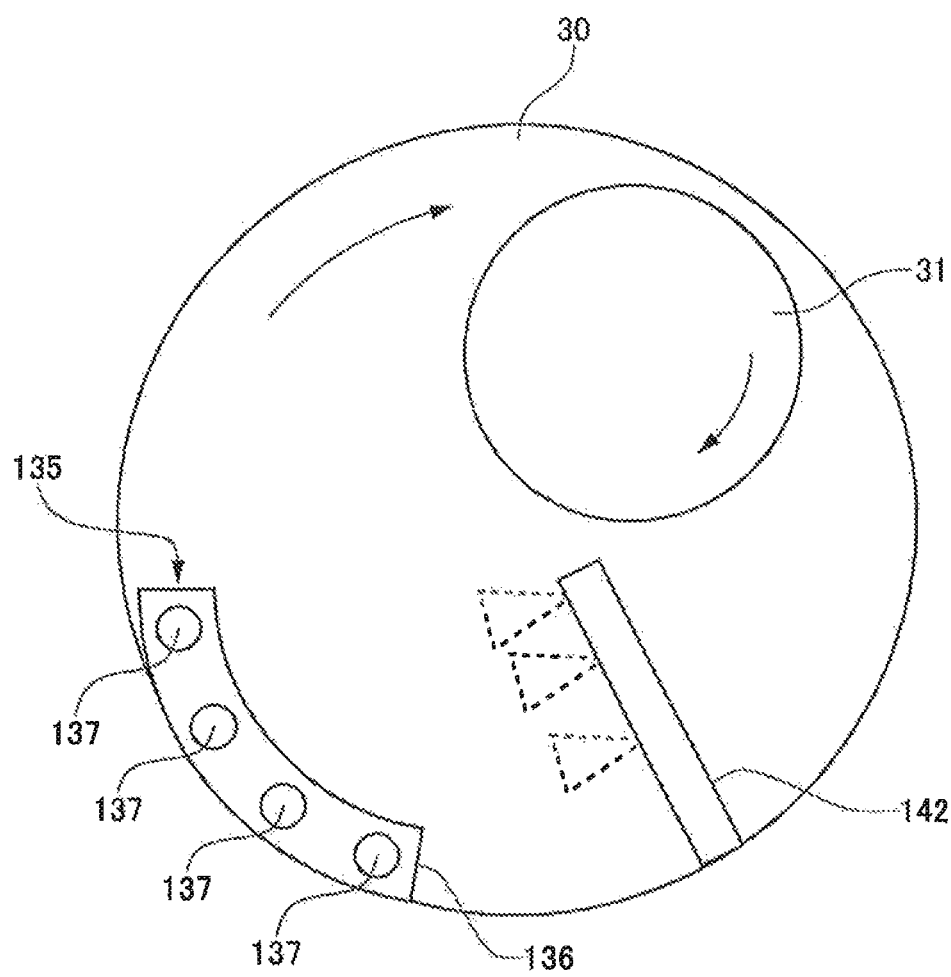
FIG. 16 is a plan view illustrating a main configuration of a substrate polishing apparatus in a third embodiment.
Figure 17:
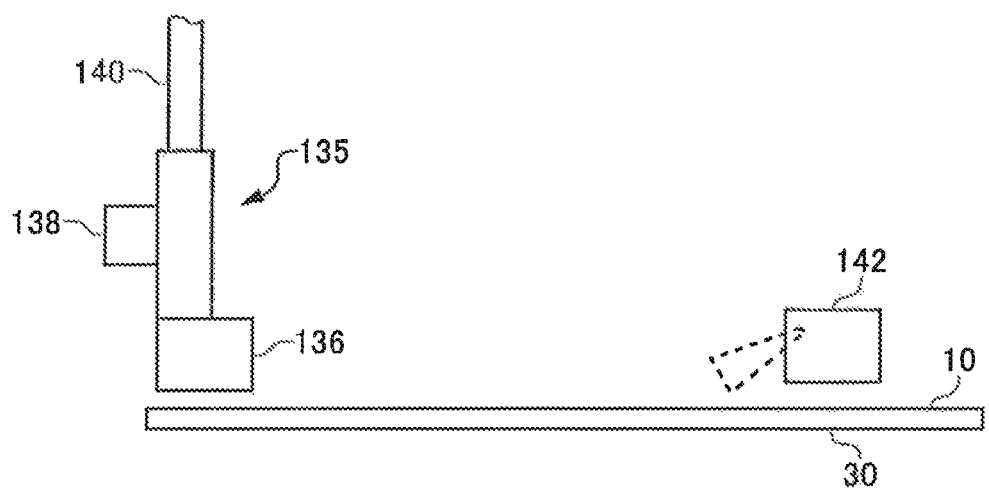
FIG. 17 is a side view illustrating the main configuration of the substrate polishing apparatus in the third embodiment.

Next, a characteristic configuration of a substrate polishing apparatus of a third embodiment will be described with reference to the drawings. FIGS. 16 and 17 are illustrations showing a main configuration of the substrate polishing apparatus of this embodiment.

As shown in FIGS. 16 and 17, the substrate polishing apparatus of this embodiment includes a polishing table 30 having a polishing surface 10 in the upper surface, a top ring 31 that holds a wafer W having a surface to be polished in the lower surface and a local exhaust mechanism 135 disposed near the top ring 31. The polishing surface 10 includes, for example, a polishing pad. The polishing table 30 rotates in a predetermined rotation direction (clockwise rotation in FIG. 16) and the top ring 31 presses the surface to be polished of the held wafer W (lower surface in FIG. 17) against the polishing surface 10 of the polishing table 30 to polish the surface to be polished of the wafer W. Note that the substrate polishing apparatus may further include a table cover that covers the outer side of the polishing table 30 and a top ring cover that covers the outer side of the top ring 31.

As shown in FIG. 16, on the downstream side of the top ring 31, a pad cooling nozzle 142 for cooling the polishing pad (polishing surface 10) is provided. A gas sprayed from the pad cooling nozzle 142 (cooling gas) cools the polishing surface 10. On the downstream side of the pad cooling nozzle 142, a local exhaust mechanism 135 is provided. This local exhaust mechanism 135 can locally exhaust the gas sprayed from the pad cooling nozzle 142.

An intake head 136 of the local exhaust mechanism 135 is disposed on the downstream side of the pad cooling nozzle 142 (and the top ring 31) in a rotation direction of the polishing table 30 (on the rotation direction side). Also, the intake head 136 includes a plurality of inlets 137 arrayed in a radial direction of the polishing table 30.

As shown in FIG. 17, the inlets 137 of the intake head 136 are connected to an ejector 138, and by making a compressed air to flow into the ejector 138, air is sucked in through the inlets 137. The ejector 138 is configured so that adjusting a flow rate of the compressed air allows an intake air speed of the inlet 137 to be adjusted. In such a situation, the intake air speed of the inlet 137 of the plurality of inlets 137 on the outer side in the radial direction is set to be higher than that of the inlet 137 on the inner side in the radial direction (see FIG. 16). Note that an intake means from the inlet 137 is not limited to the ejector 138, but, for example, a vacuum pump or the like may be used as the means.

An intake air speed of the intake head 136 is preferably set to be higher than a rotation speed of the polishing table 30. That is, the intake air speed of the intake head 136 is set to be one or more times the rotation speed of the polishing table 30 (for example, 1 to 2 m/s). For example, the intake air speed of the intake head 136 is set to be 1.2 to 2 times the rotation speed of the polishing table 30. The intake air speed of the intake head 136 can be set based on the rotation speed of the polishing table and a reference area. The reference area is calculated from the product of a diameter of a wafer W and a reference height. The reference height may be set based on a distance between the top ring 31 and the intake head 136. For example, the reference height is set to be 0.3 to 3 times the distance between the top ring 31 and the intake head 136. Also, the reference height may be set based on a height from the polishing surface 10 to the upper end of an opening of the top ring 31 (the upper end of a gap of a retainer ring). For example, the reference height is set to be 1 to 3 times the height from the polishing surface 10 to the upper end of the opening of the top ring 31 (the upper end of the gap of the retainer ring).

Figure 18:
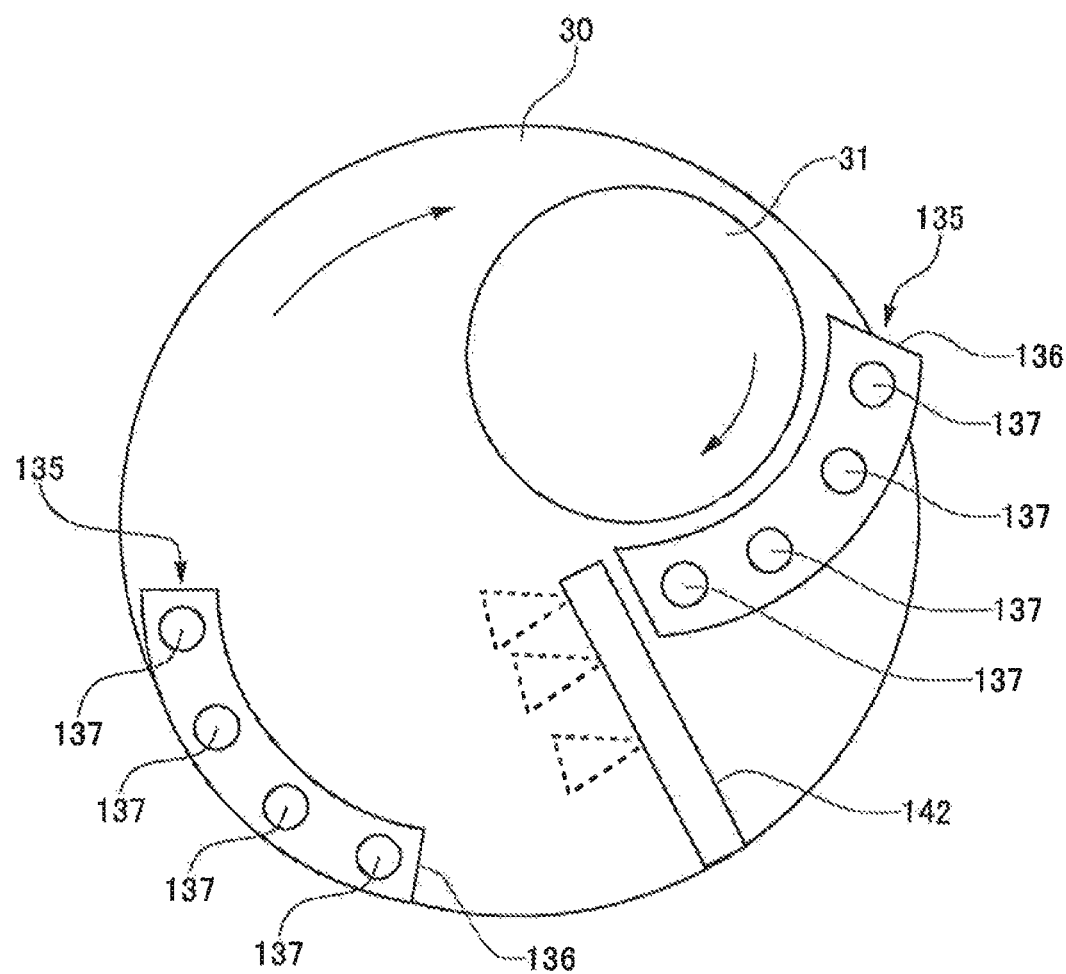
FIG. 18 is a plan view illustrating a main configuration of an example of variation of the third embodiment.

Note that, as shown in FIG. 18, the local exhaust mechanism 135 may be disposed not only on the downstream side of the top ring 31 but near the top ring 31. That is, two local exhaust mechanisms 135 (the local exhaust mechanism 135 on the downstream side of the top ring 31 and the local exhaust mechanism 135 near the top ring 31) may be provided. In such a situation, the local exhaust mechanism 135 on the downstream side of the top ring 31 can locally exhaust the gas sprayed from the pad cooling nozzle 142 and the local exhaust mechanism 135 near the top ring 31 can exhaust a reaction gas of a material to be polished and the slurry.

What is claimed is:

1. A substrate polishing apparatus, comprising:
    a rotating polishing table comprising a polishing face on the rotating polishing table;
    a substrate holding portion that holds a substrate and presses the substrate against the polishing table to polish the substrate; and
    a local exhaust mechanism configured to suck a gas,
    wherein the local exhaust mechanism comprises an intake head disposed near the substrate holding portion,
    wherein the intake head is disposed on a downstream side of the substrate holding portion in a rotation direction of the polishing table,
    wherein the intake head comprises at least one inlet whose opening is facing upward, and
    wherein a bottom end of an ejector is vertically connected to an inlet of the intake head, and the gas moves upward into the local exhaust mechanism.

2. The substrate polishing apparatus according to claim 1, wherein
    an intake air speed of the intake head is set to be higher than a rotation speed of the polishing table.

3. The substrate polishing apparatus according to claim 2, wherein
    the intake head comprises a plurality of inlets arrayed in a radial direction of the polishing table,
    an intake air speed of the inlet of the plurality of inlets on the outer side in a radial direction is set to be higher than that on the inner side in the radial direction.

4. The substrate polishing apparatus according to claim 1, wherein the gas is a hazardous gas generated when the wafer is polished, or the gas is a gas made to flow by an air current swirl flow generated from rotation of the polishing table.

5. The substrate polishing apparatus according to claim 1, wherein the intake head is arranged above the polishing face.

6. A substrate polishing apparatus, comprising:
    a rotating polishing table comprising a polishing face on the rotating polishing table;
    a substrate holding portion that holds a substrate and presses the substrate against a polishing table to polish the substrate;
    a pad cooling nozzle for cooling a polishing pad that polishes the substrate, the pad cooling nozzle being configured to spray a cooling gas, wherein an output of the pad cooling nozzle is directed downstream in a rotation direction; and a local exhaust mechanism configured to suck the cooling gas, wherein the local exhaust mechanism comprises an intake head, the output of the pad cooling nozzle facing the local exhaust mechanism, wherein the intake head is disposed on a downstream side of the pad cooling nozzle in a rotation direction of the polishing table, and wherein an ejector is connected to the intake head.

7. The substrate polishing apparatus according to claim 6, comprising:

a second local exhaust mechanism comprises a second intake head is disposed near the substrate holding portion, wherein the second intake head is disposed on the downstream side of the substrate holding portion in the rotation direction of the polishing table.

8. The substrate polishing apparatus according to claim 6, wherein the gas is a hazardous gas generated when the wafer is polished, or the gas is a gas made to flow by an air current swirl flow generated from rotation of the polishing table.

9. The substrate polishing apparatus according to claim 6, wherein the intake head is arranged above the polishing face.

10. A substrate processing apparatus, comprising:

a polishing portion covered by a partition wall;

a cleaning portion; and a transport mechanism that transports a substrate between the polishing portion and the cleaning portion;

wherein the polishing portion comprises:

a polishing table having a polishing surface in an upper surface;

a substrate holding portion that holds a substrate having a surface to be polished in a lower surface and presses the surface to be polished of the substrate against the polishing surface of the polishing table to polish the surface to be polished of the substrate; and a shielding mechanism located between the polishing table and the partition wall, the shielding mechanism covering an outer side surface of the substrate holding portion and an outer side surface of the polishing table, wherein the shielding mechanism includes an opening portion on a side wall for allowing the substrate to pass through the shielding mechanism, wherein a top of the opening portion is higher than the polishing table, and a bottom of the opening portion is lower than the polishing surface of the polishing table.

11. The substrate processing apparatus according to claim 10, wherein the shielding mechanism is one of a vinyl curtain, panels and bellows.

* * * * *